United States Patent [19]

Nicholas

[11] 4,287,660
[45] Sep. 8, 1981

[54] METHODS OF MANUFACTURING SEMICONDUCTOR DEVICES

[75] Inventor: Keith H. Nicholas, Reigate, England

[73] Assignee: U.S. Philips Corporation, New York, N.Y.

[21] Appl. No.: 963,546

[22] Filed: Nov. 24, 1978

Related U.S. Application Data

[63] Continuation of Ser. No. 789,879, Apr. 22, 1977, abandoned, which is a continuation of Ser. No. 574,510, May 5, 1975, abandoned.

[30] Foreign Application Priority Data

May 21, 1974 [GB] United Kingdom ............... 22583/74

[51] Int. Cl.³ .......................................... H01L 21/223
[52] U.S. Cl. ...................................... 29/571; 29/580; 29/590; 29/591; 148/187; 357/23
[58] Field of Search ............... 29/571, 578, 580, 590, 29/591; 148/175, 187; 156/628; 357/49, 59, 23

[56] References Cited

U.S. PATENT DOCUMENTS 3,411,051 11/1968 Kilby ..................................... 357/49
3,576,478 4/1971 Watkins ................................ 29/571
3,623,923 11/1971 Kennedy .............................. 29/578

Primary Examiner—G. Ozaki
Attorney, Agent, or Firm—Thomas A. Briody; Robert T. Mayer; Paul R. Miller

[57] ABSTRACT

A method of manufacturing a semiconductor device is set forth in which a masking layer is formed on part of the surface of a deposited layer of a relatively high resistivity polycrystalline semiconductor material being present on an insulating layer provided at a surface of a semiconductor body or portion thereof. A relatively low resistivity conductive region having a substantially uniform narrow line width is defined in the polycrystalline layer by effecting a diffusion process to laterally diffuse a doping element into a portion of the polycrystalline layer underlying an edge portion of the masking layer without diffusing the doping element through the insulating layer into the semiconductor body or portion thereof.

14 Claims, 23 Drawing Figures

METHODS OF MANUFACTURING SEMICONDUCTOR DEVICES

This is a continuation of application Ser. No. 789,879, filed Apr. 22, 1977, now abandoned, which was a continuation of application Ser. No. 574,510, filed May 5, 1975, now abandoned.

This invention relates to methods of manufacturing semiconductor devices, particularly, but not exclusively, semiconductor integrated circuits comprising a plurality of insulated gate field effect transistors having gate electrodes formed as doped parts of a deposited layer initially of high resistivity polycrystalline semiconductor material.

In the manufacture of some known semiconductor integrated circuits which comprise a plurality of insulated gate field effect transistors, a deposited layer of high resistivity polycrystalline silicon has a plurality of discrete portions defined therein and subsequently doped by diffusion. The discrete portions form gate electrodes of transistors and further extend on an insulating layer on the semiconductor body surface as conductive connection layers between various circuit elements. Such integrated circuits are commonly referred to as "silicon gate" circuits. Various techniques exist for defining and doping the discrete portions in the polycrystalline silicon layer. However one problem encountered is that it is difficult to define in such a high resistivity deposited layer of polycrystalline semiconductor material a pattern having relatively narrow lines and apertures, for example lines and apertures having a width less than 2 microns and possibly as small as 0.3 micron. Furthermore it is also desired to define such discrete portions having suitably sloping edges in order to avoid cracking and protrusions in a subsequently deposited overlying layer.

In some commonly occurring integrated circuits comprising a plurality of insulated gate field effect transistors a memory cell comprises a cross-coupled pair of the transistors. The drain of each transistor of the pair is directly connected to the gate of the other transistor of the pair and each transistor has a load impedance in series with the source. To keep the power dissipation low it is essential that the load impedances are high and for this reason it has been common practice to form these impedances as further insulated gate field effect transistors having their gates connected to their drains. In this manner a load impedance of controlled magnitude can be obtained in a simple manner and occupy much less area than when formed as a conventional resistor in which the bulk resistivity of a separate semiconductor region between two ohmic contacts thereto is utilized. However there exists a limit of the impedance value that can be obtained in this manner for a given surface area of the semiconductor body occupied by the load transistor. This is due to the fact that for a high impedance value a transistor having its gate shorted to the drain should have a high l/w ratio where l is the length of the channel region between the source and drain regions and w is the width of the channel region corresponding substantially to the width of the gate electrode. With conventional processing technology as used for forming so-called "silicon gate" circuits there exists a lower limit on the value of w than can be reproducibly obtained.

According to the invention there is provided a method of manufacturing a semiconductor device in which a masking layer is formed on part of the surface of a deposited layer of relatively high resistivity polycrystalline semiconductor material present on an insulating layer. The insulating layer is provided at a surface of a semiconductor body or body part and a relatively low resistivity conductive region having a substantially uniform narrow line width is defined in the polycrystalline layer by effecting a diffusion process to laterally diffuse a doping element into a portion of the polycrystalline layer underlying an edge portion of the masking layer without diffusing the doping element through the insulating layer into the semiconductor body or body part.

In this method doping of at least one portion of the polycrystalline layer is obtained by lateral diffusion into a surface masked portion of the layer whereas with the previously used methods diffusion is effected directly and transversely into an upper surface of an exposed portion of a polycrystalline layer. In this manner the line width of a relatively low resistivity conductive region may be accurately controlled and have a significantly smaller value than hitherto reproducibly obtainable by the previously used methods. Furthermore a plurality of such portions having narrow line widths may be obtained having sloping edges of desired configuration with respect to the subsequent application of further layers by deposition on the portions. In accordance with the kind of device to be manufactured the low resistivity conductive region may be used for various purposes and the non-diffused portions of the polycrystalline layer may be either removed or retained as will be described hereinafter. However in one particular form of the method to be described hereinafter the low resistivity conductive region having a substantially uniform line width is selectively removed to leave an aperture of relatively narrow width, the aperture being required in the further processing for the manufacture of a semiconductor device.

In some embodiments of the method, hereinafter referred to as the first main embodiments, at an edge portion of the masking layer an edge of the polycrystalline layer is exposed throughout the thickness of the polycrystalline layer and diffusion of the doping element is effected laterally into the polycrystalline layer via the exposed edge portion to form a relatively low resistivity diffused strip portion of substantially uniform width.

In one such first main embodiment, subsequent to the diffusion process the masking layer is removed and the polycrystalline layer is subjected to an etching treatment to selectively remove the undiffused portions thereby leaving at said edge of the polycrystalline layer the relatively low resistivity diffused strip portion. In some applications, including one to be described hereinafter, it may not be necessary to remove the undiffused portions and in fact not even necessary to remove the masking layer.

In another first main embodiment the diffusion effected into the edge of the polycrystalline layer comprises first diffusing a doping element characteristic of one conductivity type followed by diffusing a doping element characteristic of the opposite conductivity type in a higher concentration but to a lesser distance laterally in the layer so that a p-n junction extending substantially in the direction of thickness of the layer is formed between the outermost diffused region characteristic of the opposite conductivity type and the adjoining diffused region characteristic of the one conductivity type of substantially uniform width and situated below the masking layer. Subsequent to this double diffusion process the masking layer may be removed and the polycrystalline layer subjected to an etching treatment to selectively remove the outermost diffused region of the opposite conductivity type and the undiffused portions of the layer and thereby leave adjacent to the edge of the polycrystalline layer a relatively low resistivity diffused strip portion of the one conductivity type and of substantially uniform width. In this manner it is possible to form a fine line of doped polycrystalline material of the one conductivity type having a well defined upper edge without discontinuities.

In some other embodiments of the method, hereinafter referred to as second main embodiments, the masking layer is of smaller area than the polycrystalline layer on which it is present so that adjacent the edge portion of the masking layer the upper surface of the polycrystalline layer is exposed, the diffusion process comprising first diffusing a doping element characteristic of one conductivity type into the exposed surface such that lateral diffusion of the element occurs under the masking layer and then diffusing a doping element characteristic of the opposite conductivity type into the exposed surface in a higher concentration but to a lesser distance laterally in the layer so that a p-n junction extending substantially in the direction of the thickness of the layer is formed under the masking layer between the outermost diffused region of the opposite conductivity type and the adjoining diffused region of the one conductivity type of substantially uniform width and extending under the masking layer. Subsequent to the double diffusion process the masking layer may be removed and the polycrystalline layer subjected to an etching treatment to selectively remove only the relatively narrow diffused region of the one conductivity type and thereby form in the polycrystalline layer an aperture of relatively narrow and substantially uniform width. This form of the method may be employed, for example, in the manufacture of a charge coupled device (CCD) in which the insulated gate electrodes are formed from a layer of polycrystalline semiconductor material and apertures of the relatively narrow and substantially uniform width are formed in the layer to define the electrodes with a very close spacing.

One or more of the first main embodiments of the method may be employed in the manufacture of a semiconductor device comprising at least one insulated gate field effect transistor, the relatively low resistivity diffused strip portion of the polycrystalline semiconductor layer forming at least part of the gate electrode of the transistor. This method of forming the transistor may have significant advantages where it is desired to have a narrow channel region, that is a gate electrode in the form of a narrow strip, as will be described hereinafter in connection with one specific embodiment.

In one form of such a method in which subsequent to the diffusion process the masking layer is removed and the polycrystalline layer is subjected to a selective etching treatment to remove the undiffused portions of the polycrystalline layer, subsequent to the selective etching at least parts of the source and drain regions of the transistor are formed by impurity introduction into the semiconductor body at opposite sides of the diffused strip portion of the polycrystalline layer, the strip portion masking against impurity introduction into the portion of the semiconductor body lying below the strip portion. In this self-registered method of forming the source and drain regions the impurity introduction may be effected by ion implantation, for example, by implanting ions through the insulating layer present on the semiconductor body surface on opposite sides of the diffused strip portion of the polycrystalline layer.

The semiconductor device manufactured by one of the first main embodiments of the method may be an integrated circuit comprising a plurality of insulated gate field effect transistors having their gate electrodes formed by doped portions of the polycrystalline semiconductor layer, the insulated gate field effect transistor in which the diffused strip portion constitutes at least part of the gate electrode being formed as a resistive load transistor and having the gate electrode connected to the drain region. In this manner a high load impedance may be obtained by using such a transistor because the provision of the gate electrode at least in part by the diffused strip portion of the polycrystalline layer enables a high l/w ratio to be obtained.

Such an integrated circuit may comprise two of the transistors formed as resistive loads and having their gate electrodes connected to a common drain region, the gate electrodes of the two transistors comprising laterally diffused strip portions of the polycrystalline layer of substantially uniform widths and situated at opposite edges of a single part of the polycrystalline layer. When in such an integrated circuit the semiconductor body is of silicon and the deposited polycrystalline layer is also of silicon, the method in accordance with the invention may be employed in such manner that the departure from conventionally employed "silicon gate" processing is minimal and effectively may only involve the addition of one non-critical masking stage as will be described hereinafter in connection with a specific embodiment of such a method.

Thus in the said circuit comprising the said two load transistors the diffusion to form the gate electrode strip portions of the polycrystalline layer may be effected in the presence of a masking layer locally present on the part of the polycrystalline layer, the diffusion being carried out simultaneously with the diffusion to form at least part of the source and drain regions of the transistors and to render more highly conductive other exposed portions of the polycrystalline layer, for example portions which are to constitute gate electrodes of other transistors in the integrated circuit.

The masking layer locally present on part of the polycrystalline layer may comprise a residual part of a layer provided at the surface of the polycrystalline layer and employed for the previous definition of the polycrystalline layer into a plurality of discrete parts, for example a layer of silicon oxide or silicon nitride.

The method may be employed in the manufacture of a semiconductor device in the form of an integrated circuit in which at least one portion of the polycrystalline semiconductor layer constitutes a conductive track which crosses and is insulated from an underlying diffused connection region in the semiconductor body, the opposite edge portions of the track at the area of the crossing being converted into low resistivity diffused strip portions by the lateral diffusion in the presence of a masking layer on the track at the area of the crossing. In this manner a compact crossing connection can be achieved and this may be incorporated in conventional "silicon gate" processing by the addition of a single non-critical mask alignment stage and only one additional diffusion step.

In one form of such an integrated circuit including a crossing of this configuration the integrated circuit comprises a plurality of insulated gate field effect transistors having their gate electrodes formed by doped portions of the polycrystalline semiconductor layer, the method being employed such that diffusion is carried out to form at least part of the source and drain regions of transistors and to dope exposed upper surface portions of the polycrystalline semiconductor layer.

In another form of the method in which lateral diffusion is employed to form low resistivity diffused strip portions of a conductive track, subsequent to forming the low resistivity diffused strip portions at the opposite edge portions of the track at the area of the crossing, the undiffused central portion of the track at the area of the crossing is selectively removed and a further diffusion is carried out to form at the area of the crossing a diffused surface region in the semiconductor body in the form of a strip situated intermediate the portions of the body above which the low resistivity diffused strip portions of the track are present, the diffused surface region forming part of the diffused connection region. In some embodiments this further diffusion step is also carried out to form at the area of the crossing diffused surface regions in the semiconductor body situated adjacent and extending inwardly below the opposite edges of the track at which the low resistivity diffused strip portions have been formed, the diffused surface regions forming parts of the diffused connection region. It is not necessary that the last mentioned diffused surface regions should extend in contact with the intermediately situated diffused strip region, but it is only necessary that the spacing and the resistivity of the adjoining material of the body should be such that in operation the depletion layers associated with the junctions between these regions and the adjoining material of the body meet to establish the continuity of the diffused connection region. Preferably the spacing and the resistivity are such that the depletion layers meet with no applied bias across the junctions.

Embodiments of the invention will now be described, by way of example, with reference to the accompanying diagrammatic drawings, in which:

FIGS. 1(a) to 1(e) show in cross-section part of a semiconductor body and applied layers during successive stages in a first embodiment of the method in accordance with the invention;

FIGS. 2(a) to 2(c) show in cross-section part of a semiconductor body and applied layers during successive stages in a second embodiment of the method in accordance with the invention;

FIGS. 3(a) and 3(b) show in plan view and in cross-section respectively part of a semiconductor body and applied layers during a stage in the manufacture of a device comprising an insulated gate field effect transistor by a method in accordance with the invention and FIG. 3(c) shows in cross-section the semiconductor body at a later stage in the manufacture;

FIGS. 4(a) and 4(b) show in cross-section part of a semiconductor body and applied layers during various stages in a further embodiment of the method in accordance with the invention;

FIGS. 5(a) and 5(b) show in plan view and cross-section respectively part of the semiconductor body and applied layers of a prior art "silicon gate" integrated circuit in which an insulated gate field effect transistor having its gate electrode shorted to the drain region is used as load impedance;

Figure 1A:
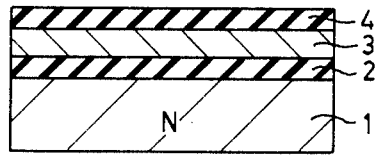
Figure 1B:
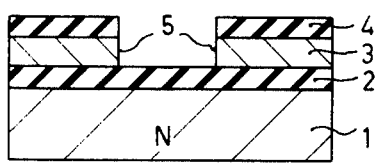
Figure 1C:
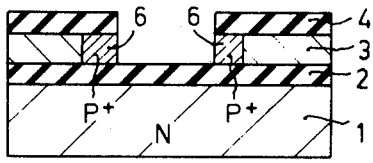

Referring now to FIG. 1 there will be described in general outline one illustrative embodiment of the method in accordance with the invention. On the surface of an n-type silicon substrate 1 of 250 microns thickness and 4 ohm-cm. resistivity there is thermally grown a silicon oxide layer 2 of 0.1 micron thickness by any conventionally employed method. On the surface of the silicon oxide layer there is deposited a layer of high resistivity polycrystalline silicon 3 of 0.6 micron thickness, this layer being provided by any commonly used method. On the surface of the polycrystalline silicon layer 3 there is deposited a masking layer of silicon nitride 4 of 0.2 micron thickness. By first depositing a further masking silicon oxide layer (not shown) and then carrying out a photomasking and etching process an aperture of 10 microns width is formed in the masking layer 4 of silicon nitride. Thereafter the further masking silicon oxide layer is removed and the portion of the polycrystalline silicon layer 3 underlying the opening formed in the silicon nitride layer is removed. This exposes in the aperture an edge portion 5 (FIG. 1(b)) of the polycrystalline layer 3. A boron diffusion step is now carried out into the layer 3, via the exposed edge 5, at a temperature of 1075° C. for 10 minutes, using a boron nitride source. The masking layer 4 of silicon nitride masks against direct diffusion of boron into directly underlying portions of the layer 3 and the silicon oxide layer 2 in the aperture masks against diffusion of boron into the underlying portion of the silicon body 1. Boron is diffused into the layer 3 laterally under the silicon nitride masking layer 4 to form in the polycrystalline layer 3 adjacent the edge of the aperture a relatively low resistivity conductive region 6 (FIG. 1(c)) in the form of a diffused p+-strip portion 6 having a substantially uniform line width of approximately 1 micron. The measured value of the sheet resistance of the portion 6 is 100 ohms per square. The boundary between the p+-portion 6 and the remaining portion of the layer 3 is considered as the location where the diffused boron concentration is $10^{-3}$ times the value of the diffused boron concentration at the surface through which the diffusion was effected.

Figure 1D:
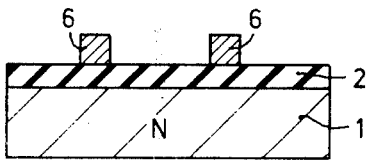

After the boron diffusion step the remaining portion of the silicon nitride masking layer 4 is removed by dissolving in hot phosphoric acid and then the polycrystalline silicon layer 3, 6 is subjected to a selective etching treatment to remove the undiffused portions 3 and thereby leave the relatively low resistivity diffused strip portion 6 (FIG. 1(d)) of closed configuration situated adjacent the edge of the previously formed aperture 5. This is carried out by etching with a fluid consisting of 180 cc. of ethylene diamine, 30 gms. of pyracatechol and 80 cc. of water. The etching is carried out at a temperature approaching the boiling point of the etchant fluid and in the region of 110° C.

Figure 1E:
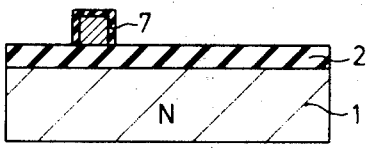

The next step in the processing is to remove part only of the diffused strip portion 6 of the polycrystalline layer. This is carried out by first depositing a thin silicon oxide masking layer over the whole surface including the strip portion 6. By means of a photomasking and etching step this silicon oxide masking layer is removed except from the area of the strip portion 6 desired to be retained. The exposed parts of the strip portion 6 are then dissolved in a solution consisting of 50 cc. of concentrated nitric acid, 20 cc. of water and 1 cc. of 40% hydrofluoric acid. There remains a diffused strip part 7 of the polycrystalline silicon layer in the form of a linear portion of 1 micron width and 20 microns length. FIG. 1(e) shows the remaining strip part 7 having the residual portion of the thin silicon oxide masking layer thereon. The strip 7 may form, for example, the gate electrode of an insulated gate field effect transistor.

It will be appreciated that the masking layer 4 used may be of a material other than silicon nitride, for example of silicon oxide.

Figure 2A:
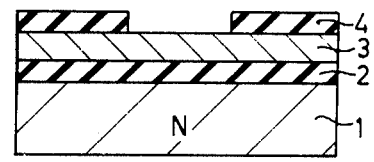
Figure 2B:
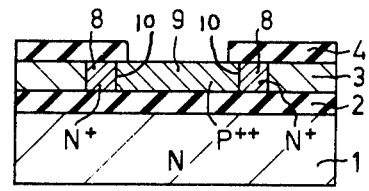
Figure 2C:
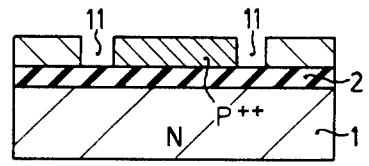

Referring now to FIGS. 2(a) to 2(c), in this embodiment the semiconductor substrate 1, silicon oxide layer 2, polycrystalline silicon layer 3 and silicon nitride masking layer 4 are provided in the same manner as in the previous embodiment. An aperture is formed in the silicon nitride masking layer 4 without removing the underlying portion of the polycrystalline silicon layer 3 so that the residual masking layer is therefore of smaller area than the polycrystalline layer on which it is present and adjacent the edge portion of the masking layer formed by the aperture therein the upper surface of the polycrystalline silicon layer 3 is exposed. A phosphorus diffusion step is then carried out by diffusing phosphorus, for 10 minutes at 1050° C. using a phosphorus oxychloride source, into the exposed surface portion of the layer 3 such that lateral diffusion of phosphorus occurs in the layer 3 under the maskig layer 4 to form a relatively low resistivity n+-conductive region. Thereafter any residual oxide layer formed during the phosphorus diffusion step is removed in a suitable etchant and a boron diffusion step carried out under the same conditions as in the previous embodiment to diffuse boron into the exposed surface of the layer 3 in a higher concentration than the previously diffused phosphorus but to a lesser distance laterally in the layer. FIG. 2(b) shows the structure thus obtained with an n+diffused region in the form of a strip of substantially uniform width of 1 micron extending under the edge of the masking layer 4 and adjoining a p++ diffused region in the aperture, a p-n junction 10 between the strip 8 and the outermost diffused region 9 extending substantially in the direction of thickness of the layer 3 and below the masking layer 4. In this embodiment also, the boundary between the n+-strip 8 and the undiffused portion of the layer is considered as the location where the diffused phosphorus concentration is $10^{-3}$ times the value at the surface through which the diffusion was effected.

The residual portion of the silicon nitride masking layer 4 is removed by dissolving in hot phosphoric acid and then the polycrystalline silicon layer is subjected to a selective etching treatment to remove only the relatively narrow n+-diffused strip portion 8 and thereby form in the polycrystalline silicon layer a strip-form aperture 11 of closed configuration of 1 micron width. The etchant used comprises hydrofluoric acid, nitric acid and acetic acid.

Figure 3A:
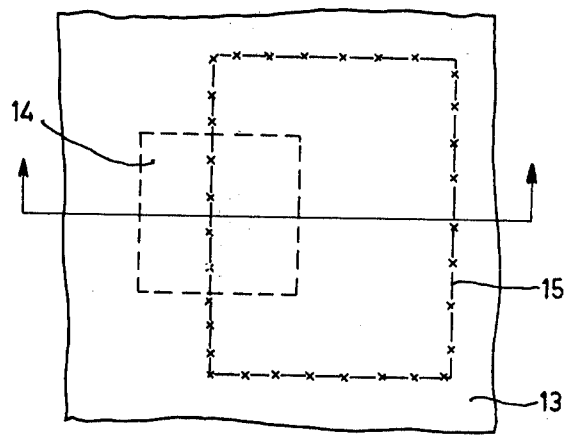
Figure 3B:
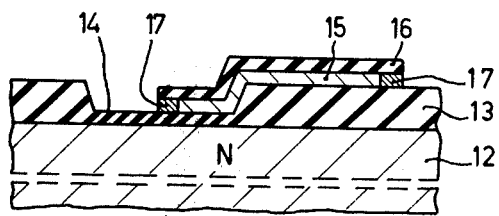
Figure 3C:
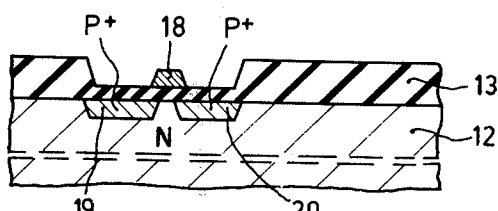

Referring now to FIGS. 3(a) to 3(c) there will be described in outline part of the manufacture of a semiconductor device comprising an insulated gate field effect transistor by a method in accordance with the invention. On an n-type silicon substrate 12 of 4 ohm-cm. resistivity and 250 microns thickness there is thermally grown a relatively thick silicon oxide layer 13 of 1 micron thickness. An aperture 14 is formed in the thick oxide layer 13 by a photomasking and etching step, the extent of this aperture being indicated by a broken line in FIG. 3(a). A relatively thin silicon oxide layer 14 of 1200 Å thickness is thermally grown on the silicon surface exposed in the aperture.

A polycrystalline silicon layer 15 is deposited over the whole upper surface of the body. A masking layer 16 of silicon nitride is deposited over the entire surface of the polycrystalline silicon layer 15 and a further masking layer (not shown) of silicon oxide deposited on the silicon nitride layer. By a photomasking and etching step an aperture is formed in the upper silicon oxide masking layer and the portion of the silicon nitride masking layer 16 exposed by said aperture is selectively removed together with the underlying portion of the polycrystalline silicon layer. Thereafter the remaining portion of the upper silicon oxide layer is removed. The polycrystalline silicon layer is thus defined as a plurality of discrete portions including the portion 15 shown in FIGS. 3(a) and 3(b) and each covered with a portion of the silicon nitride masking layer 16. The extent of the polycrystalline silicon layer portion 15 is indicated in FIG. 3(a) by a chain line.

A boron diffusion step is carried out as described with reference to FIG. 1 to diffuse boron laterally into the polycrystalline silicon layer portion 15 via the exposed edges thereof. This diffusion form a p+-strip 17 at the edge of the layer portion 15 and located below the silicon nitride masking layer 16. The p+-strip 17 has a width of approximately 1 micron.

The remaining portions of the silicon nitride masking layer, including the portion 16, are removed by dissolving in hot phosphoric acid. Thereafter the polycrystalline silicon layer is subjected to a selective etching treatment using the etchant as described with reference to FIG. 1 to remove the undiffused portions of the polycrystalline silicon layer and leave the p+-diffused strip 17.

A further processing step may now be carried out to remove part of the p+-strip 17, this comprising the deposition of a further masking layer, a photomasking and etching stage to leave covered by the further masking layer only the portion of the strip 17 it is desired to retain, an etching step to remove the exposed portion of the strip 17, and finally removal of the remaining portion of the further masking layer.

There remains, as shown in FIG. 3(c) a linear strip 18 of p+-diffused polycrystalline silicon on the thin oxide layer 14. This forms the gate electrode of an insulated gate field effect transistor, p+-source and drain regions 19 and 20 respectively being formed by implanting boron ions in the semiconductor body through the exposed parts of the thin oxide layer 14 while using the masking effect of the gate electrode 18 to give a self-registered structure. Thereafter electrical connection to the source and drain regions and to the gate electrode is made by any suitable conventionally employed method which involves etching contact windows, deposition of a metallization layer and its subsequent definition by photomasking and etching techniques. It will be appreciated that this is a generalized embodiment serving to illustrate the use of the method to form a gate electrode of narrow width in an insulated gate field effect transistor and when such a transistor forms part of an integrated circuit then the further connection of the various regions of the transistor will have to be considered. In particular the contacting of the strip gate may involve special measures to be adopted in the processing. This may be effected by locally providing the polycrystalline silicon in contact with the silicon surface where an implanted region is to be formed, or by overlapping the end of the gate with an applied metal contact layer at an area on the thick oxide layer, or by an extra diffusion step carried out prior to providing the silicon nitride masking layer and involving the diffusion of boron into an edge portion of the polycrystalline silicon layer which will be continuous with the gate strip when formed in said layer.

Figure 4A:
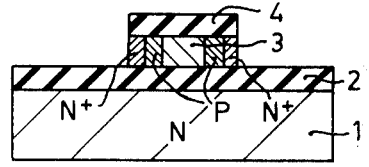
Figure 4B:
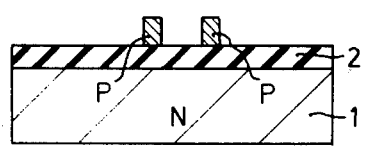

Referring now to FIGS. 4(a) and 4(b) a further embodiment of the first main form of the method will be described. The starting material and initially applied layers are exactly the same as in the embodiment described with reference to FIG. 1, namely the n-type silicon substrate 1, the silicon oxide masking layer 2, the high resistivity deposited polycrystalline silicon layer 3 and the silicon nitride masking layer 4. By applying a further masking layer of silicon oxide and carrying out a photomasking and etching step a portion of the silicon nitride layer 4 is removed by dissolving in hot phosphoric acid so that only a central portion of substantially rectangular configuration remains. The portion of the high resistivity polycrystalline silicon layer 3 thus exposed is then removed by etching with the nitric acid and hydrofluoric acid solution referred to in the embodiment described with reference to FIG. 1. A boron diffusion step is then carried out to diffuse boron laterally into the edge of the portion of the high resistivity polycrystalline layer under the silicon nitride masking layer 4. The boron diffusion is effected at 1,050° C. for 20 minutes such that boron diffuses laterally under the silicon nitride layer 4 to a distance of 1 micron for a $10^{-3}$ reduction in concentration of diffused boron. Thereafter a further diffusion step is carried out using phosphorus, this diffusion being effected laterally via the edge of the portion of the polycrystalline layer and previously having boron laterally diffused therein. The phosphorus is diffused at 1,050° C. for 5 minutes using a phosphorus oxychloride source. In this manner phosphorus is laterally diffused at a higher concentration but at a small distance in the edge portions of the polycrystalline layer. The silicon oxide layer 2 masks against introduction of boron or phosphorus into the portion of the silicon body underlying the polycrystalline layer during said diffusions into the edge portions of the polycrystalline layer. The outer $n^+$-regions formed by the phosphorus diffusion form a p-n junction with the inner p-type region at a lateral distance of approximately 0.5 micron from the edges. These junctions extend substantially perpendicular to the plane of the main surface of the silicon oxide layer 2 on the silicon body. This results in the definition of inner p-type regions in the form of strips of 0.5 micron width.

The remaining portion of the silicon nitride masking layer 4 is removed and the exposed polycrystalline silicon layer is subjected to a selective etching treatment to leave only the p-type strips as shown in FIG. 4(b). The etchant used consists of 180 cc. of ethylene diamine, 30 gms. of pyracatechol and 80 cc. of water. The p-type strips thus formed having a substantially constant width of 0.5 micron are such that the edges of the strips are well defined and substantially free of irregularities. The p-type strips shown in the section of FIG. 4(b) actually form part of a closed single strip located on the silicon oxide layer 2 at an area corresponding to the area of periphery of the portion of the polycrystalline silicon layer remaining masked by the silicon nitride layer after the initial removal of part of the silicon nitride layer 4 and underlying polycrystalline silicon layer 3. If desired further treatments may be carried out to selectively remove at least a portion of this strip.

Figure 5A:
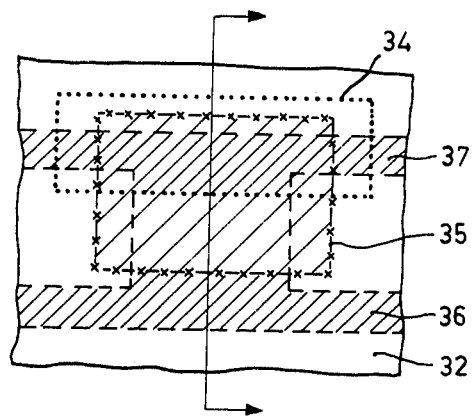
Figure 5B:
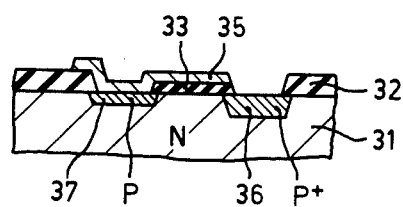

Referring to FIGS. 5(a) and 5(b) there will now be described a prior art form of "silicon gate" integrated circuit in which a load impedance connected to one insulated gate field effect transistor is constituted by a second insulated gate field effect transistor having the gate electrode shorted to the drain region. For the sake of clarity of illustration only that part of the circuit where the second insulated gate field effect transistor is present is shown in FIGS. 5(a) and 5(b) and these Figures show this part at a stage in the manufacture prior to providing a contact pattern. The integrated circuit comprises a silicon substrate 31 having thereon an insulating layer of silicon oxide comprising a relatively thick portion 32 and a relatively thin portion 33. In FIG. 5(a) the boundary between the thick oxide 32 and the thin oxide 33 which corresponds to the location of an aperture initially formed in the thick oxide 32 prior to providing therein the thin oxide 33 is shown in a broken line. A continuous line 34 of dots in FIG. 5(a) indicates the area over which the thin oxide 32 has been removed such lying within the boundary of said line 34 using a non-critical mask alignment stage. This local removal of the thin oxide layer has been followed by the deposition of a high resistivity polycrystalline silicon layer over the whole surface and its subsequent definition into a plurality of discrete portions. One such portion is the portion 35 which constitutes the gate electrode of the transistor. It is apparent from FIG. 5(b) that the gate electrode 35 extends in contact with the silicon body surface where the thin oxide layer 33 was locally removed prior to the deposition of the polycrystalline silicon layer. The transistor comprises $p^+$-diffused source and drain regions 36 and 37 respectively. These regions 36 and 37 have been formed by diffusion of boron into portions of the silicon body surface exposed by removing the parts of the thin oxide layer 33 that are not covered by the discrete portions of the polycrystalline silicon layer that are subsequently defined. During this diffusion the gate electrode 35 is doped with the boron but the diffusion of boron does not occur into the underlying channel region of the transistor. It will be apparent from FIG. 5(b) that where the gate electrode 35 extends in contact with the silicon body surface the diffusion of boron at this location in the body which has occurred via this portion of the polycrystalline silicon layer extends to a lesser depth in the body. However this part of the drain region 37 is continuous with the adjoining deeper diffused $p^+$-portions 36 of the drain region beyond the thus doped polycrystalline silicon layer portion 35. Thus in this transistor the gate electrode 35 is shorted to the drain region 37. It will be apparent that to obtain such a resistive load transistor with a high value resistance, then for a fixed resistivity of the channel region it is necessary to have a large ratio of channel length l to channel width w and hitherto the problem has been that there is a limit on the value to which w can be reduced and hence this has necessitated a very large channel length l to obtain the desired ratio for providing a high value resistance.

Figure 6:
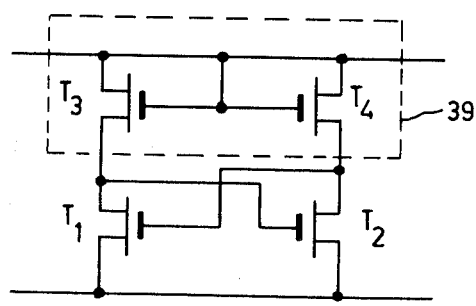
FIG. 6 is a circuit diagram showing part of a memory cell formed in a known integrated circuit, the memory cell including a cross-coupled pair of insulated gate field effect transistors each having in series with its source a load impedance constituted by an insulated gate field effect transistor having its gate electrode shorted to the drain region.

FIG. 6 shows a circuit diagram of a memory cell part of an integrated circuit comprising a plurality of insulated gate field effect transistors. A cross-coupled pair of transistors $T_1$ and $T_2$ have load impedances in series with the sources and respectively constituted by transistors $T_3$ and $T_4$. The transistors $T_3$ and $T_4$ having a common drain region have their gate electrodes connected together and shorted to the common drain region. An integrated circuit test pattern form of that portion of the circuit shown in FIG. 6 within the broken line 39 will now be described, with reference to FIGS. 7 to 10, together with a method of manufacturing such an integrated circuit in "silicon gate" form by a method in accordance with the invention.

Figure 7:
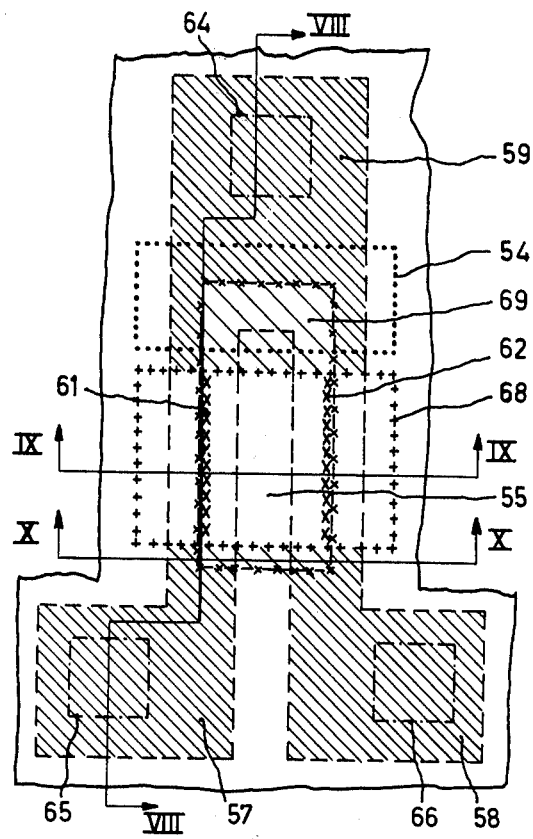
FIG. 7 shows in plan view part of a semiconductor body in which the load transistors shown in the circuit diagram of FIG. 6 are present in integrated form and obtained by a method in accordance with the invention.

In FIG. 7 the broken line, the continuous line of dots and the chain line have the same notation as in the structure shown in FIG. 5(a). Thus the part of the integrated circuit shown comprises an n-type silicon substrate 51 of 4 ohm-cm. resistivity and 275 microns thickness having thereon a relatively thick silicon oxide layer part 52 of 1.0 micron thickness and a relatively thin silicon oxide layer part 53 of 1200 Å thickness. The continuous line of dots 54 indicates the area over which the thin oxide layer 53 was locally removed by etching following a masking stage which involved a non-critical mask alignment. A discrete portion 55 of a deposited layer of high resistivity polycrystalline silicon is present and the boundary of said portion is indicated by a chain line in FIG. 7. The inclined hatching in FIG. 7 indicates the regions where boron has been diffused. The closely spaced inclined hatching lines within the broken line indicating the boundary of the thick oxide layer 52 indicate p+-diffused surface regions formed by diffusion in the silicon body 51 at areas where the thin oxide layer 53 has been removed. These include the source regions 57 and 58 of the transistors $T_3$ and $T_4$ respectively and the common drain region 59 of these transistors. The gate electrodes of these transistors are formed by laterally diffused low-resistivity strip portions 61 and 62 respectively at opposite edges of the high resistivity polycrystalline silicon layer portion 55.

The upper surface of the integrated device is covered with a deposited layer 63 of silicon oxide and within this layer apertures 64, 65 and 66 are present via which are respectively contacted the common drain region 59 of the transistors $T_3$ and $T_4$, the source region 57 of the transistor $T_3$ and the source region 58 of the transistor $T_4$. It will be appreciated that the part of the integrated circuit shown in plan view in FIG. 7 constitutes a test pattern and therefore contact apertures 64, 65 and 66 are provided. In a full integrated circuit the difference resides in that no such separate apertures are present because the diffused regions 57 and 58 concerned form part of other circuit elements, via the drain regions of the cross-coupled pair of transistors $T_1$ and $T_2$ in the memory cell shown in FIG. 6, and the diffused region 59 will form an interconnection to other memory cells.

In the manufacture of the integrated device shown in FIGS. 7 to 10, subsequent to the deposition of the polycrystalline silicon layer on the whole upper surface of the body a masking layer of silicon oxide is applied to the whole surface of the polycrystalline silicon layer. Portions of this masking layer are then selectively removed together with underlying portions of the polycrystalline silicon layer so that there remain a plurality of discrete polycrystalline silicon portions each having its surface covered by the masking layer material of silicon oxide. This corresponds to the normal "silicon gate" processing and in such a process the masking layer of silicon oxide is removed by etching in the next stage of the processing together with the portions of the thin oxide layer 53 exposed upon the selective removal of the polycrystalline silicon. The manufacture of the integrated device shown in FIGS. 7 to 10 differs from the normal "silicon gate" processing at this stage in that prior to the etching an additional masking of the silicon oxide layer is carried out using photoresist which is selectively exposed and developed so that over a rectangular area 68 indicated by the continuous line of crosses an additional masking layer of photoresist is provided. Thereafter the etching of the exposed silicon oxide masking layer on the polycrystalline silicon layer together with the etching of the exposed portions of thin oxide layer 53 is carried out. At this stage the part of the polycrystalline layer portion 55 lying within the rectangle 68 thus has layers of silicon oxide and photoresist thereon. The residual portion of the photoresist layer is now removed to leave a silicon oxide layer portion 71 on that part of the polycrystalline silicon layer portion 55 situated within the area of the rectangle denoted by a line of crosses.

The next stage in the processing corresponds with the normal "silicon gate" processing in that a boron diffusion step is carried out. The difference arises, however, that for the transistors $T_3$ and $T_4$ the boron diffusion into the polycrystalline silicon to render the gate electrode portions more highly conductive is a lateral diffusion under the silicon oxide masking portion 71 and via the edge portions of the layer part 55. This results in narrow strip portions 61 and 62 on opposite sides of the high resistivity polycrystalline silicon portion 55, said strip portions being of 1 micron width and 30 microns length and shown in FIGS. 7, 8 and 9 in crossed hatching lines. The boron diffusion is also effected into exposed portions of the polycrystalline silicon layer portion at the other two opposite ends of the polycrystalline silicon layer portion 55 situated beyond the silicon oxide masking 71 within the area of the rectangle 68. The boron is also diffused into exposed portions of the silicon body surface to form the source and drain regions of the transistors $T_3$ and $T_4$. Also boron diffusion is effected into the exposed portion 69 of the polycrystalline layer which is in direct contact with the surface of the silicon body portion within the rectangular area 54 where the thin oxide was locally removed before the deposition of the polycrystalline silicon layer. This so called 'CS' (for contact silicon) contact yields the desired connection between the gate electrodes 61, 62 and the common drain region 59.

In this manner the laterally diffused strips 61 and 62 form gate electrodes of the transistors $T_1$ and $T_4$ and due to their narrow width of 1 micron and the self-registration of the source and drain regions the channels of these transistors have an l/w ratio of approximately 30. This yields load transistors having a high series resistance of the order of $1.0 \times 10^6$ ohms with a voltage of 8 volts on the gates and common drain relative to the sources.

In this embodiment the gate electrodes formed by the laterally diffused strips 61 and 62 are joined by the remaining undiffused center portion of the high resistivity polycrystalline layer portion 55. In some instances this remaining connection between the gate electrodes may be undesirable because of the difficulty in obtaining reproducibly a sufficiently high resistivity of the polycrystalline silicon layer intermediate the strips and therefore a consequent lack of control of the effective width of the gate electrode strips 61 and 62. Therefore in such instances the processing may be suitably modified to enable the removal of the undiffused center portion. One such adaptation of the previously described process will now be given. In this adaptation the deviation starts with the definition of the high resistivity polycrystalline silicon layer into a plurality of discrete portions. Thus, subsequent to the deposition of the high resistivity polycrystalline silicon layer a silicon nitride layer of 0.1 micron thickness is deposited on the entire upper surface of the polycrystalline silicon layer followed by the deposition of a silicon oxide masking layer of 0.2 micron thickness. By a photomasking and etching step the upper silicon oxide masking layer is removed according to the same masking pattern as used for the definition of the polycrystalline silicon layer into a plurality of discrete portions in the unmodified processing. The portions of the silicon nitride layer thus exposed are then removed. Thereafter all the residual portions of the upper silicon oxide masking layer present on the remaining silicon nitride layer portions are removed. This is followed by the removal by etching of the portions of the polycrystalline silicon layer exposed where the silicon nitride layer has been removed. Thus at this stage of the processing at which the polycrystalline silicon layer has been defined as a plurality of discrete portions the device is as in the normal processing with the exception that each discrete portion of the polycrystalline layer has a silicon nitride layer thereon instead of a silicon oxide layer thereon. These silicon nitride layer portions are later selectively removed by a conventional plasma etching method. However prior to this plasma etching a further photomasking process is carried out, using a non-critical mask alignment stage, to leave a layer of photoresist on that portion of the upper surfaces of the various layers within the rectangular area 68 defined by the line of crosses in FIG. 7. The plasma etching is then carried out to remove the remaining exposed silicon nitride layer parts. With the additional photoresist layer still in place the thin oxide layer 53 is now etched away in those areas where it has been exposed on account of the previous removal of the overlying polycrystalline silicon layer. Thus where the thin oxide layer 53 is present within the rectangular area 68 it is protected by the photoresist layer and therefore remains present during said etching. Following this the photoresist is removed and the boron diffusion step as described in the previous embodiment is carried out to form the low resistivity gate electrode strips 61, 62, the source and drain electrode regions of the transistors and to render more highly conductive the exposed upper surface portions of the polycrystalline silicon layer. This differs from the diffusion as described in the previous embodiment only in that the masking on the polycrystalline silicon portion 55 within the area 68 is of silicon nitride instead of silicon oxide.

Subsequent to the boron diffusion the residual portion of the silicon nitride layer on the polycrystalline silicon portion 55 is removed and thereafter a selective etching treatment is carried out to remove the undiffused center portion of the polycrystalline silicon portion 55 lying between the low-resistivity diffused strips 61 and 62.

Figure 8:
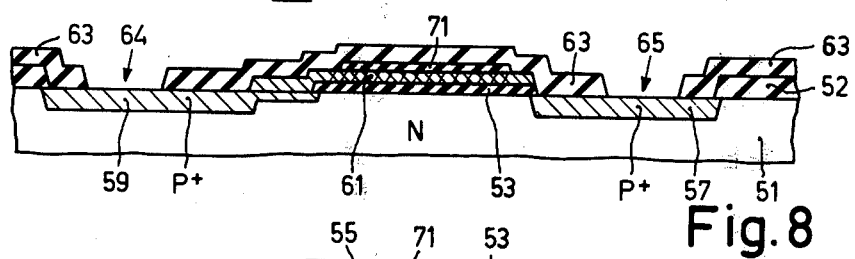
FIGS. 8, 9 and 10 are cross-sectional views along the lines VIII—VIII, IX—IX and X—X respectively in FIG. 7.
Figure 9:
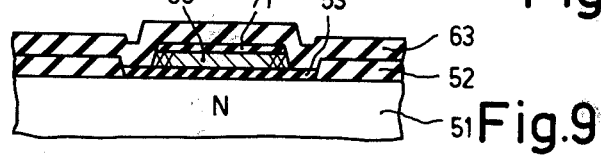
Figure 10:
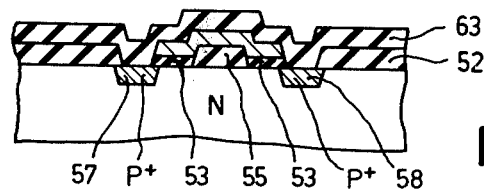

The subsequent processing both for the first described embodiment of the method for forming the integrated circuit of which part is shown in FIGS. 7 to 9 and for the modified, second described embodiment of the method involves the deposition of a silicon oxide glass passivation layer 63, the opening of contact apertures, the deposition of an interconnection metal layer, the definition of the layer, mounting and encapsulation in accordance with conventionally employed processing.

Figure 11:
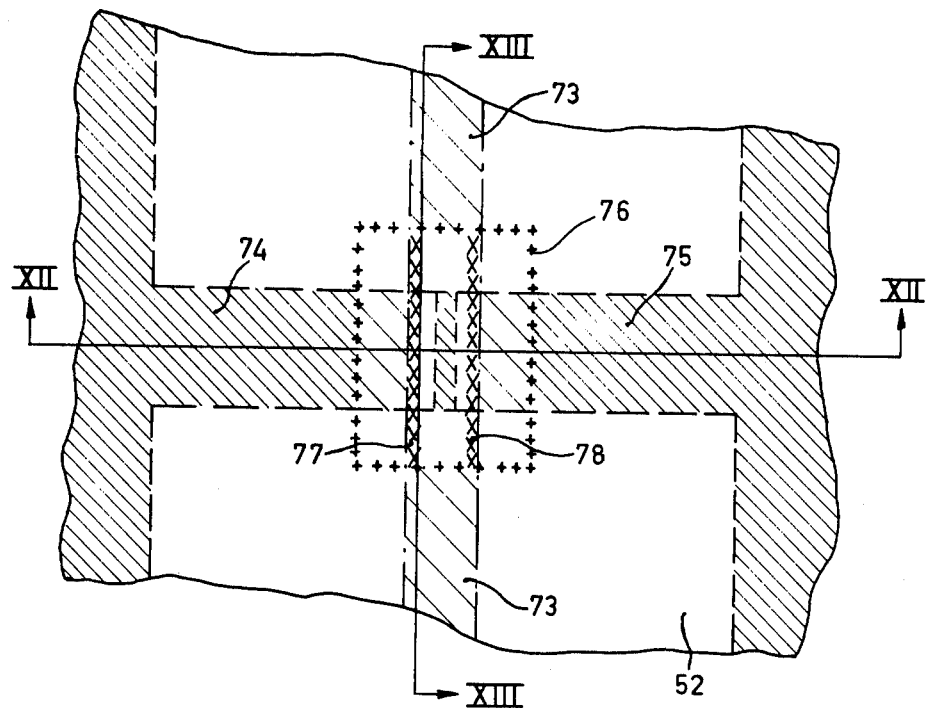
FIG. 11 shows in plan view part of a semiconductor body of a further integrated circuit comprising a plurality of insualted gate field effect transistors.
Figure 12:
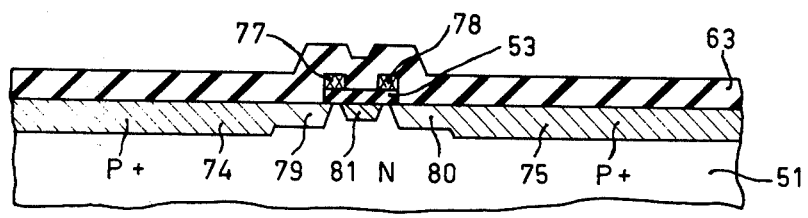
FIG. 12 and 13 are cross-sectional views along the lines XII—XII and XIII—XIII respectively in FIG. 11.
Figure 13:
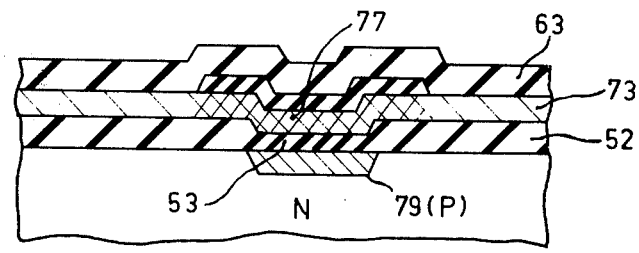

Referring now to FIGS. 11 to 13 a further embodiment of the method in accordance with the invention will be described. In this embodiment the semiconductor device is an integrated circuit comprising a plurality of insulated gate field effect transistors having gate electrodes formed of doped polycrystalline silicon, the circuit being formed by a similar process as the unmodified form described with reference to FIGS. 7 to 10. In the embodiment now to be described the method as was employed to form the gate electrode strips 61 and 62 by lateral diffusion in the polycrystalline silicon layer portion in the unmodified process, is now employed to form a crossing connection in a simple manner with the addition of only one non-critical mask alignment stage and a diffusion step. The crossing connection is between a doped polycrystalline layer portion 73 and a diffused connection region comprising $p^+$-regions 74 and 75 at opposite sides of the area at which the crossing occurs and further p-type regions 79, 80 and 81. The $p^+$-regions 74 and 75 are formed as diffused regions bounded by the thick oxide layer 52 and these regions may be contiguous with main electrode regions of two insulated gate field effect transistors. The polycrystalline silicon layer portion 73 is in the form of a track of 10 microns width which lies on the thicker oxide layer 52 with the exception of the area of the crossing where it lies on the thinner oxide layer 53. Within the rectangular area 76 indicated by the line of crosses the polycrystalline silicon layer portion forming part of the track 73 has been left covered with a masking layer of silicon oxide on its surface at a stage of the processing just prior to the boron diffusion. This is achieved with a non-critical mask alignment stage. Furthermore at the opposite edges of the track the thin oxide layer 53 remains within the rectangular area 76 at this stage of the processing. The boron diffusion is carried out as in the previously described embodiments to laterally diffuse boron below the silicon oxide masking layer on the track 73 within the area 76 and form conductive strip portions 77 and 78 each 15 microns in length and each of 1 micron width at opposite edges of the track. The boron diffusion is also effected to render more highly conductive the exposed upper surface portions of the track 73 situated on the thick oxide layer 52 beyond the rectangular area 76. Furthermore, as the silicon surface is exposed where the thin oxide layer 53 has been removed (with the exception of within the rectangular area 76) boron is diffused in these areas to form the $p^+$-regions including the regions 74 and 75 which constitute parts of the connection region.

The next step in the processing is to remove the remaining portion of the silicon oxide masking layer present on the track 73 within the rectangular area 76 and to remove the portions of the thin oxide layer 53 on opposite sides of the track 73 also within the rectangular area 76. The undiffused portion of the polycrystalline silicon track 73 between the diffused strip portions 77 and 78 is then removed selectively using a preferential etching treatment. A further boron diffusion step is then carried out to form diffused surface regions 79 and 80 adjacent the opposite sides of the track where the thin oxide layer 52 has been removed. This second diffusion is also carried out to diffuse boron through the thin oxide layer 53 where exposed by the selective removal of the undiffused polycrystalline silicon track 73 and to form a p-type surface region 81 having on its opposite sides the p-type regions 79 and 80. Due to the lateral diffusion of boron in the silicon body when forming the regions 79, 80 and 81, the outer regions 79 and 80 are each spaced from the region 81 by approximately 0.5 micron. These regions 79, 80 and 81 constitute parts of a p-type diffused connection region including and extending between the p+-regions 74 and 75. With an n-type substrate 51 of 4 ohm-cm. resistivity the spacing (0.5 micron) of the region 81 from the regions 79 and 80 is sufficiently small that the junction depletion layers where they adjoin will meet and thus complete the connection even when there is no applied bias across the junctions between the substrate 51 and the regions 79, 80 and 81.

Thus in this manner a simple crossing is achieved between a polycrystalline silicon track 73 and an underlying diffused connection region of which the p+-regions 74 and 75 form the opposite ends, because (a) the low resistivity laterally diffused strip portions 77 and 78 complete the conductive path in the track between doped portions of the polycrystalline silicon track 73 on the thick oxide layer 52 at opposite sides of the crossing and (b) the depletion layers associated with the junctions between the p-type regions 79, 80, 81 and the n-substrate 51 complete the conductive path in the connection region between the parts 74 and 75 via the diffused p-type regions 79, 80 and 81.

It will be appreciated that many modifications may be made within the scope of the present invention. For example, the semiconductor body may be of a material other than silicon, the polycrystalline semiconductor layer may be of a semiconductor material other than silicon, and materials other than silicon oxide and silicon nitride may be used for the masking. The embodiment in which the method in accordance with the invention is used to form a crossing connection in an integrated circuit may be employed in the manufacture of integrated circuits other than the said 'silicon gate' circuits, for example in bipolar integrated circuits.

What we claim is:

1. A method of manufacturing a semiconductor device comprising a low resistivity conductive region having a substantially uniform narrow line width, said method comprising the steps of: (a) providing a semiconductor element having an insulating layer disposed at at least a surface part thereof, (b) depositing a layer of relatively high resistivity polycrystalline semiconductor material on said insulating layer, (c) forming a masking layer on a part of the exposed surface of said polycrystalline layer, (d) removing a part of said polycrystalline layer such that an edge thereof is exposed throughout the thickness thereof at an edge portion of said masking layer, (e) diffusing via the exposed edge portion a doping element laterally into a portion of said polycrystalline layer underlying said edge portion of said masking layer in the substantial absence of diffusing said doping element through said insulating layer itself into the semiconductor element, thereby forming said conductive region, (f) removing said masking layer, and (g) subjecting at least a part of the exposed polycrystalline layer adjacent said conductive region to an etching treatment to selectively remove undiffused portions thereof.

2. A method as claimed in claim 1, wherein subsequent to the diffusion process the masking layer is removed and the polycrystalline layer is subjected to an etching treatment to selectively remove the undiffused portions thereof to thereby leave at said edge of the polycrystalline layer said low resistivity conductive region.

3. A method as claimed in claim 1, wherein the device manufactured comprises at least one insulated gate field effect transistor and said conductive region of said polycrystalline semiconductor layer forms at least part of the gate electrode of said transistor.

4. A method as in claim 1, wherein said semiconductor device is an integrated circuit and at least one portion of said polycrystalline semiconductor layer constitutes a conductive track which crosses and is insulated from an underlying diffused connection region in said semiconductor body, the opposite edge portions of the track at the area of the crossing being converted into said low resistivity conductive regions by said lateral diffusion in the presence of a masking layer on the track at the area of the crossing.

5. A method as in claim 4, wherein said integrated circuit comprises a plurality of insulated gate field effect transistors having their gate electrodes formed by doped portions of said polycrystalline semiconductor layer, said diffusion also being carried out to form at least parts of the source and drain regions of transistors and to dope exposed upper surface portions of said polycrystalline semiconductor layer.

6. A method as in claim 4, wherein subsequent to forming said low resistivity diffused conductive regions at the opposite edge portions of the track at the area of the crossing, any remaining undiffused central portion of the track at the area of the crossing is selectively removed and a further diffusion is carried out to form at the area of the crossing a diffused surface region in the semiconductor body in the form of a strip situated intermediate the portions of the body above which said low resistivity diffused conductive regions of the track are present, said diffused surface region forming part of the diffused connection region.

7. A method as in claim 6, wherein the further diffusion step is also carried out to form at the area of the crossing diffused surface regions in the semiconductor body situated adjacent and extending inwardly below said opposite edges of the track at which said low resistivity diffused conductive regions have been formed, said diffused surface regions forming parts of the diffused connection region.

8. A method of manufacturing a semiconductor device comprising a low resistivity conductive region with a substantially uniform narrow line width and comprising at least one insulated gate field effect transistor, said method comprising the steps of: (a) providing a semiconductor element having an insulating layer disposed at at least a surface part thereof, (b) depositing a layer of relatively high resistivity polycrystalline semiconductor material on said insulating layer, (c) forming a masking layer on a part of the exposed surface of said polycrystalline layer, (d) removing a part of said polycrystalline layer such that an edge thereof is exposed throughout the thickness thereof at an edge portion of said masking layer, (e) diffusing via said exposed edge portion a doping element laterally into a portion of said polycrystalline layer underlying said edge portion of said masking layer without diffusing said doping element through said insulating layer itself into said semiconductor element, thereby forming said conductive region, and (f) forming from said conductive region at least part of a gate electrode for said transistor.

9. A method as in claim 8, wherein at least parts of the source and drain regions of said transistor are formed by introducing an impurity into said semiconductor body at opposite sides of said conductive regions, said conductive region masking against impurity introduction into the portion of the semiconductor body lying below said strip portion.

10. A method as in claim 9, wherein said semiconductor device is an integrated circuit comprising a plurality of insulated gate field effect transistors having their gate electrodes formed by doped portions of said polycrystalline semiconductor layer, said insulating gate field effect transistor in which said conductive region constitutes at least part of the gate electrode being formed as a load transistor and having the gate electrode connected to the drain region.

11. A method as in claim 10, wherein said integrated circuit comprises two of said transistors formed as loads and having their gate electrodes connected to a common drain region, the gate electrodes of said two transistors comprising laterally diffused conductive regions of said polycrystalline layer of substantially uniform widths and situated at opposite edges of a single part of said polycrystalline layer.

12. A method as in claim 11, wherein said diffusion step to form said gate electrode conductive regions of the polycrystalline layer is effected in the presence of a masking layer locally present on said part of the polycrystalline layer, said diffusion being carried out simultaneously with the diffusion to form at least part of the source and drain regions of the transistors and to render more highly conductive other exposed portions of the polycrystalline layer.

13. A method as in claim 12, wherein said masking layer comprises a residual part of a layer provided at the surface of said polycrystalline layer and employed for the previous definition of said polycrystalline layer into a plurality of discrete parts.

14. A method of manufacturing a semiconductor device having low resistivity conductive regions with a substantially uniform narrow line width, said method comprising the steps of: (a) providing a semiconductor element having an insulating layer disposed on at least a surface part thereof, (b) depositing a layer of relatively high resistivity polycrystalline semiconductor material on said insulating layer, (c) forming a masking layer on said polycrystalline layer, (d) removing any exposed portions of said polycrystalline layer such that only edges thereof are exposed throughout the thickness thereof under edge portions of said masking layer, and (e) laterally diffusing a doping element into said polycrystalline layer only at said edges thereof under said masking layer without diffusing said doping element through said insulating layer itself into said semiconductor element, thereby forming said low resistivity regions.

* * * * *